United States Patent

Coumou

(10) Patent No.: US 8,581,597 B2
(45) Date of Patent: *Nov. 12, 2013

(54) APPLICATION OF WIDEBAND SAMPLING FOR ARC DETECTION WITH A PROBABILISTIC MODEL FOR QUANTITATIVELY MEASURING ARC EVENTS

(71) Applicant: MKS Instruments, Inc., Andover, MA (US)

(72) Inventor: David J. Coumou, Webster, NY (US)

(73) Assignee: MSK Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/648,317

(22) Filed: Oct. 10, 2012

(65) Prior Publication Data

US 2013/0073241 A1 Mar. 21, 2013

Related U.S. Application Data

(63) Continuation of application No. 12/175,867, filed on Jul. 18, 2008, now Pat. No. 8,289,029, which is a continuation-in-part of application No. 12/031,171, filed on Feb. 14, 2008, now Pat. No. 8,264,237.

(51) Int. Cl.
H01H 9/50 (2006.01)

(52) U.S. Cl.
USPC ............... 324/536; 156/345.28; 315/111.21

(58) Field of Classification Search
USPC ................. 324/356; 315/111.21; 156/345.28
See application file for complete search history.

(56) References Cited

U.S. PATENT DOCUMENTS

| 3,020,529 | A | 2/1962 | Turner |
| 3,519,927 | A | 7/1970 | Holt |
| 4,588,952 | A | 5/1986 | Matsuoka et al. |
| 5,810,963 | A | 9/1998 | Tomioka |
| 6,124,758 | A | 9/2000 | Korte et al. |
| 6,718,272 | B1 | 4/2004 | Fisk, II et al. |
| 6,902,646 | B2 | 6/2005 | Mahoney et al. |

(Continued)

FOREIGN PATENT DOCUMENTS

| JP | 08031806 A | 2/1996 |
| JP | 08277468 A | 10/1996 |

(Continued)

OTHER PUBLICATIONS

International Search Report for International Patent Application No. PCT/US2008/083347 dated Jul. 2, 2009.

(Continued)

*Primary Examiner* — Arleen M Vazquez
*Assistant Examiner* — Son Le
(74) *Attorney, Agent, or Firm* — Harness, Dickey & Pierce, PLC

(57) ABSTRACT

An arc detection system for a plasma generation system includes a radio frequency (RF) sensor that generates first and second signals based on a respective electrical properties of (RF) power that is in communication with a plasma chamber. A correlation module generates an arc detect signal based on the first and second signals. The arc detect signal indicates whether an arc is occurring in the plasma chamber and is employed to vary an aspect of the RF power to extinguish the arc.

24 Claims, 13 Drawing Sheets

(56) References Cited

U.S. PATENT DOCUMENTS

| | | |
|---|---|---|
| 6,954,077 B2 | 10/2005 | Strang |
| 7,199,327 B2 | 4/2007 | Moroz et al. |
| 7,292,045 B2 | 11/2007 | Anwar et al. |
| 7,301,286 B2 | 11/2007 | Kuriyama et al. |
| 7,305,311 B2 | 12/2007 | van Zyl |
| 7,514,936 B2 | 4/2009 | Anwar et al. |
| 7,570,028 B2 | 8/2009 | van Zyl |
| 7,728,602 B2 | 6/2010 | Valcore et al. |
| 7,767,053 B2 | 8/2010 | Takeda et al. |
| 8,289,029 B2 * | 10/2012 | Coumou .................. 324/536 |
| 2003/0046013 A1 | 3/2003 | Gerrish |
| 2003/0063420 A1 | 4/2003 | Pahl et al. |
| 2003/0205460 A1 | 11/2003 | Buda |
| 2004/0182697 A1 | 9/2004 | Buda |
| 2005/0040144 A1 | 2/2005 | Sellers |
| 2006/0025820 A1 | 2/2006 | Phillips et al. |
| 2006/0049831 A1 | 3/2006 | Anwar et al. |
| 2006/0252283 A1 | 11/2006 | Takeda et al. |
| 2006/0259259 A1 | 11/2006 | Rozenboim et al. |
| 2008/0021664 A1 | 1/2008 | Krauss et al. |
| 2008/0197854 A1 | 8/2008 | Valcore et al. |

FOREIGN PATENT DOCUMENTS

| | | |
|---|---|---|
| JP | 11260807 A | 9/1999 |
| JP | 2001135579 A | 5/2001 |
| JP | 2003173973 A | 6/2003 |
| JP | 2006288009 A | 10/2006 |
| JP | 2007149596 A | 6/2007 |
| JP | 2007149597 A | 6/2007 |
| WO | 2005/074661 A2 | 8/2005 |

OTHER PUBLICATIONS

British Examination Report for GB1009777.2 dated Jul. 19, 2012.
British Search and Examination Report for British Patent Application No. 1219888.3, dated Nov. 19, 2012.
Chinese Office Action for Chinese Patent Application No. 200880114415.4, dated Nov. 14, 2012, and English translation thereof.
Japanese Notification of Reasons for Refusal for Japanese Patent Application No. 2010-546746, dated Jan. 15, 2013, and English translation thereof.

* cited by examiner

APPLICATION OF WIDEBAND SAMPLING FOR ARC DETECTION WITH A PROBABILISTIC MODEL FOR QUANTITATIVELY MEASURING ARC EVENTS

CROSS-REFERENCE TO RELATED APPLICATIONS

This application is a continuation of U.S. patent application Ser. No. 12/175,867 filed Jul. 18, 2008 which is a continuation-in-part of U.S. patent application Ser. No. 12/031,171 filed on Feb. 14, 2008. The disclosures of the above applications are incorporated herein by reference.

FIELD

The present disclosure relates to detecting arcs in a radio frequency (RF) plasma generation system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma chambers can be used for performing various processes such as chemical vapor deposition, sputter deposition and plasma-enhanced etching processes used in manufacturing an electronic work piece such as a semiconductor device or flat panel display. A plasma discharge is sustained by coupling RF or DC power from an electrical power source to the plasma. The coupling is accomplished typically by connecting the power source to an electrode within the chamber or to an antenna or magnetic coil within or adjacent to the chamber.

The conditions within a plasma chamber generally change during the progression of the manufacturing process being performed within the chamber, and such changes sometimes cause electrical arcing within the chamber. If any electrical arcing occurs between the plasma and the work piece being manufactured, or between the plasma any of the chamber components, damage may occur to the work piece or the chamber components.

SUMMARY

An arc detection system for a plasma generation system includes a radio frequency (RF) sensor that generates first and second signals based on respective electrical properties of (RF) power that is in communication with a plasma chamber. A correlation module generates an arc detect signal based on the first and second signals. The arc detect signal indicates whether an arc is occurring in the plasma chamber and is employed to vary an aspect of the RF power to extinguish the arc.

In other features, a subtraction module subtracts signal levels from respective ones of the first and second signals. A window module applies a window function to the first and second signals. A probabilistic module computes a probability of an arc event based on the arc detect signal. The probabilistic module employs a Baum-Welch algorithm to calculate a probabilistic model of the arc event. The probabilistic module employs a Viterbi algorithm to compute the probability of the arc event. The correlation module receives an enable signal that selectively enables generating the arc detect signal. An analog-to-digital (A/D) conversion module digitizes the first and second signals. The RF sensor can be a voltage/current (V/I) sensor wherein the first and second signals represent a voltage and current, respectively, of the RF power. The RF sensor can be a directional coupler wherein the first and second signals represent the forward power and reflected power, respectively, of the RF power.

An arc detection method for a plasma generation system includes generating first and second signals based on respective electrical properties of (RF) power that is in communication with a plasma chamber and generating an arc detect signal based on the first and second signals. The arc detect signal indicates whether an arc is occurring in the plasma chamber. The method includes employing the arc detect signal to vary an aspect of the RF power to extinguish the arc.

In other features the method includes subtracting signal levels from respective ones of the first and second signals. The method includes selecting periods of the first and second signals for communicating to the correlation module. The method includes computing a probability of an arc event based on the arc detect signal. The computing step further comprises employing a Baum-Welch algorithm to calculate a probabilistic model of the arc event. The computing step further comprises employing a Viterbi algorithm to compute the probability of the arc event. The method includes receiving an enable signal that selectively enables generating the arc detect signal. The method includes digitizing the first and second signals.

An arc detection system for a plasma generation system includes a radio frequency (RF) sensor that generates first and second signals based on a respective electric properties RF power that is in communication with a plasma chamber. An analog-to-digital (A/D) conversion module generates digital data based on the first and second signals. A subtraction module subtracts values from the digital data. A window module applies a window function to the digital data. A correlation module correlates the first and second signals as they are represented in the windowed digital data and generates an arc detect signal based on the correlation. The arc detect signal indicates whether an arc is occurring in the plasma chamber.

In other features, a probabilistic module computes a probability of an arc event based on the arc detect signal. The probabilistic module employs a Baum-Welch algorithm to calculate a probabilistic model of the arc event. The probabilistic module employs a Viterbi algorithm to compute the probability of the arc event. The correlation module receives an enable signal that selectively enables generating the arc detect signal. The RF sensor can be a voltage/current (V/I) sensor wherein the first and second signals represent a voltage and a current, respectively, of the RF power. The RF sensor can be a directional coupler wherein the first and second signals represent a forward power and a reflected power, respectively, of the RF power.

An arc detection system for a plasma generation system comprises a radio frequency (RF) sensor that generates first and second signals based on a respective electrical properties of RF power that is in communication with a plasma chamber. An analysis module generates an arc detect signal based on the first and second signals. The arc detect signal indicates whether an arc is occurring in the plasma chamber and is employed to vary an aspect of the RF power to extinguish the arc. Further, the analysis module determines an estimated energy of the arc based on the first and second signals.

In other features, a subtraction module subtracts signal levels from respective ones of the first and second signals. A window module applies a window function to the first and second signals. A probabilistic module computes a probability of an arc event based on the arc detect signal. The probabilistic module employs a Baum-Welch algorithm to calculate a probabilistic model of the arc event. The probabilistic module employs a Viterbi algorithm to compute the probability of the arc event. The analysis module receives an enable signal that selectively enables generating the arc detect signal. An analog-to-digital (A/D) conversion module digitizes the first and second signals. The RF sensor can be a directional coupler wherein the first and second signals represent the forward power and reflected power, respectively, of the RF power. The RF sensor can be a voltage/current (V/I) sensor wherein the first and second signals represent a voltage and current, respectively, of the RF power. The estimated energy of the arc may be determined by multiplying a duration of the arc and a difference in a power estimate of the voltage and current of the RF power during the arc. The power estimate may be determined by the equation:

$$r_{vi}(\tau := 0) = \sum_{\forall n} (v[n] - E[v[n]])(i[n] - E[i[n]]),$$

wherein v[n] is the voltage at time n; i[n] is the current at time n; $r_{vi}(\tau := 0)$ is the power estimate at time n; E[v[n]] is a mean of v[n] at time n; E[i[n]] is a mean of i[n] at time n; and ∀n comprises ∀n times n in a window of interest.

An arc detection method for a plasma generation system comprises generating first and second signals based on respective electrical properties of radio frequency (RF) power that is in communication with a plasma chamber and generating an arc detect signal based on the first and second signals. The arc detect signal indicates whether an arc is occurring in the plasma chamber. The method comprises employing the arc detect signal to vary an aspect of the RF power to extinguish the arc and generating an estimated energy of the arc based on the first and second signals.

In other features, the method comprises subtracting signal levels from respective ones of the first and second signals. The method comprises applying a window function to the first and second signals. The method comprises computing a probability of an arc event based on the arc detect signal. The computing step further comprises employing a Baum-Welch algorithm to calculate a probabilistic model of the arc event. The computing step further comprises employing a Viterbi algorithm to compute the probability of the arc event. The method comprises receiving an enable signal that selectively enables generating the arc detect signal. The method comprises digitizing the first and second signals. The first and second signals may represent the forward power and reflected power, respectively, of the RF power. The first and second signals may represent a voltage and current, respectively, of the RF power. The estimated energy of the arc may be determined by multiplying a duration of the arc and a difference in a power estimate of the voltage and current of the RF power during the arc. The power estimate may be determined by the equation:

$$r_{vi}(\tau := 0) = \sum_{\forall n} (v[n] - E[v[n]])(i[n] - E[i[n]]),$$

wherein v[n] is the voltage at time n; i[n] is the current at time n; $r_{vi}(\tau := 0)$ is the power estimate at time n; E[v[n]] is a mean of v[n] at time n; E[i[n]] is a mean of i[n] at time n; and en comprises ∀n times n in a window of interest.

Further areas of applicability of the present disclosure will become apparent from the detailed description provided hereinafter. It should be understood that the detailed description and specific examples are intended for purposes of illustration only and are not intended to limit the scope of the disclosure.

DRAWINGS

The drawings described herein are for illustration purposes only and are not intended to limit the scope of the present disclosure in any way.

DETAILED DESCRIPTION

Figure 1:
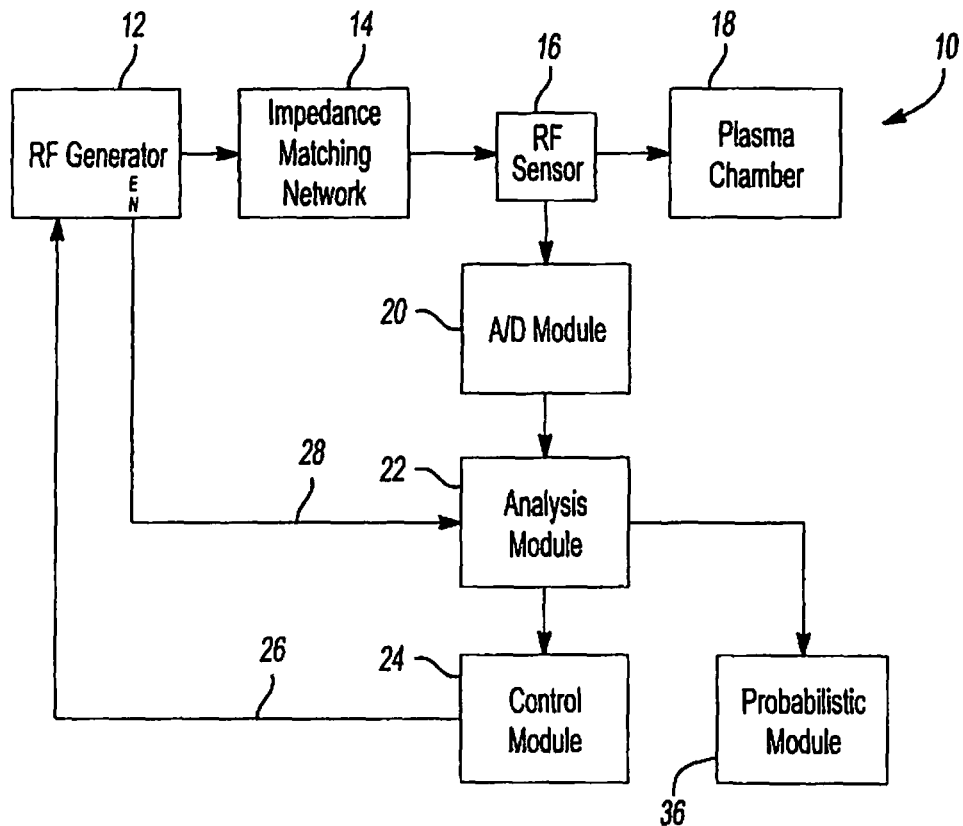
FIG. 1 is a functional block diagram of a radio frequency (RF) plasma generation system.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIG. 1, one of several embodiments is shown of a radio frequency (RF) plasma generator system 10. RF plasma generator system 10 includes an RF generator 12 that generates RF power for a plasma chamber 18. An RF sensor 16 generates first and second signals that represent respective electrical properties of the RF power. RF sensor 16 may be implemented with a voltage/current (V/I) sensor or a directional coupler. When RF sensor 16 is implemented with the V/I sensor the first and second signals represent voltage and current of the RF power, respectively. When the RF sensor 16 is implemented with the directional coupler the first and second signals represent forward and reverse power of the RF power, respectively. It should be appreciated that the remainder of this description assumes RF sensor 16 is implemented with the V/I sensor, however the description also applies when RF sensor 16 is implemented with the directional coupler. When using the directional coupler then forward and reverse power should replace references in the specification to the voltage and current of the RF power.

An impedance matching network 14 matches an output impedance of RF generator 12 to an input impedance of plasma chamber 18. Impedance matching network 14 is shown connected downstream of RF sensor 16, however it should be appreciated that it may also be connected upstream of RF sensor 16, i.e. between the RF sensor 16 and plasma chamber 18.

An analog to digital (A/D) module 20 converts the first and second signals from RF sensor 16 to respective digital signals. The digital signals are communicated to an analysis module 22. Analysis module 22 employs a correlation function to detect arcs in plasma chamber 18 based on the first and second signals. The arc detection method is described below in more detail. Analysis module 22 generates an arc detect signal based on an outcome of the arc detect method. The arc detect signal is communicated to a control module 24 and a probabilistic module 36 and indicates whether an arc is occurring in plasma chamber 18.

Control module 24 generates control signals 26 that control the RF power output of RF generator 12. Control module 24 also receives the arc detect signal and the data from the first and second signals via analysis module 22. Control module 24 generates an output based on the data and the arc detect signal. The output controls RF generator 12 such that the plasma is generated as desired and any arc detected in the plasma is extinguished in response to the arc detect signal.

In some embodiments, RF generator 12 and/or control module 24 generates an enable signal 28 and communicates it to analysis module 22. Enable signal 28 is employed when RF generator 12 initiates plasma in plasma chamber 18. While the plasma is initiating, the voltage and current of the RF power fluctuate. Enable signal 28 holds off or disables analysis module 22 such as to prevent it from misinterpreting the fluctuations as arcs.

In some embodiments, analysis module 22 may detect whether the plasma is initiating and obviate a need for enable signal 28. Analysis module 22 may determine whether plasma is initiating by monitoring the voltage and current of the RF power. When the voltage and current transition from zero to non-zero, then analysis module 22 may hold off generating the arc detect signal until after the voltage and current stabilize at non-zero values.

A probabilistic module 36 may be employed to process the arc detect signal in accordance with a method that is described below. Probabilistic module 36 uses the arc detect signal to compute a probabilistic model and to predict a probability of an arc event. The model is computed using a Baum-Welch algorithm and the probability of an arc event is computed using a Viterbi algorithm. Probabilistic module 36 may be an off-line process that generates the model after data is collected. The resulting probabilistic model becomes a quantitative indicator that determines whether variations to process parameters associated with the semiconductor manufacturing process yield a decreased likelihood of arcs of various durations.

Figure 2:
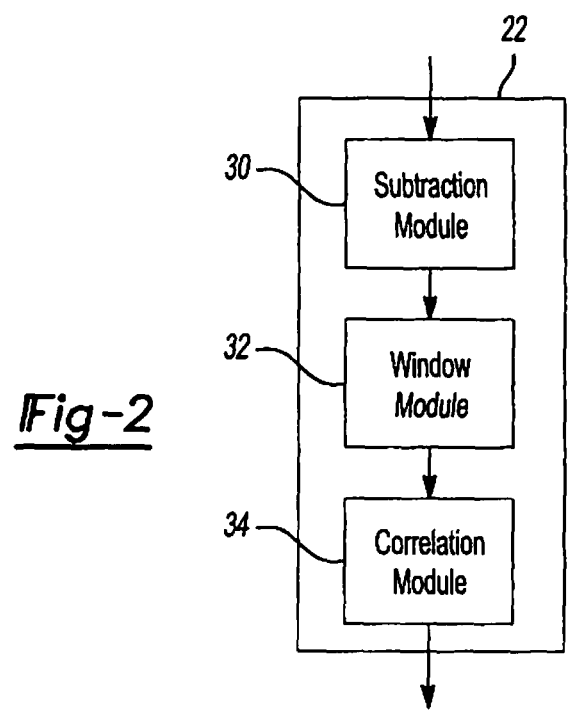
FIG. 2 is a functional block diagram of an analysis module.

Referring now to FIG. 2, a functional block diagram is shown of analysis module 22. Analysis module 22 includes a subtraction module 30, a window module 32, and a correlation module 34. Subtraction module 30 subtracts a DC offset from the digital signals that are generated by A/D module 20. Window module 32 applies a window function to the digital data from subtraction module 30. Correlation module 34 cross correlates the windowed data in accordance with a method that is described below.

Operation of correlation module 34 will now be described in more detail. The wideband, high speed digital data from A/D module 20 provides valuable information of the spectral content of the RF power present on the RF transmission line between RF generator 12 and plasma chamber 18. Spatial information contained in these signals represents transitory behavior of systems connected to the RF transmission line. Arc detection can be achieved by coupling the spatial information with computation of a correlation function within correlation module 34. Probabilistic module 36 implements a probabilistic framework to bolster arc detection and provide a quantitative measure to demonstrate process improvement by the reduction of the likelihood of an arc event.

Arc events can be characterized by rapid and abrupt transients that result from a discharge between the RF generated plasma and an electrode of plasma chamber 18. The arc events may damage devices being fabricated during a semiconductor manufacturing process. Other arc events are characterized by a discharge from the plasma to a sidewall of plasma chamber 18 and/or discharges within the plasma occurring from the build-up of polymer structures within the plasma. The polymerization of negative ions may also be referred to as dust particles. A sheath of the plasma for continuously powered plasma retains negative ions. After a period of time, these negative ions build up and polymerize to form contaminating particles. When any of these arc events occur, the transient resulting from the discharge causes perturbations on the electromagnetic signals represented by the information from A/D module 20.

Correlation module 34 implements a discrete-time auto correlation function $$r_{xx}(\tau) = \sum_{\forall n} x[n]x[n-\tau]. \tag{1}$$

where x represents one of the first and second digital signals;
n is an index of the digital sample; and
$\tau$ is a lag or delay in the function.

Eq. (1) is an even function and its maximum value occurs at τ=0. This aids in an efficient implementation of an arc detection scheme described below. Two additional properties of Eq. (1) are leveraged for the purpose of arc detection. The first property is that Eq. (1) contains a measure of the rate of change of the voltage and current. The second property is the function is periodic if the voltage and current signals contain periodic components. The correlation is performed on a windowed version of the digital signal containing N discrete time samples comprising M periods of the fundamental RF signal. Window module 32 applies the windowing function to the digital samples.

The frequency of the RF power is referred to as the fundamental signal. In the event plasma generator system 10 has multiple RF generators 12 with different operating frequencies; the fundamental signal is selected as the lowest frequency in the lowest frequency band of operation.

The procedure to compute a spectral estimation of the signal commences with subtraction module 30 subtracting a mean $\mu_x$ from the discrete-time signal x from A/D module 20.

$$\mu_x = E[x] = \frac{1}{N}\sum_{n=1}^{N} x[n] \quad (2)$$

$$\bar{x}[n] = x[n] - \mu_x \, \forall \, n \quad (3)$$

Applying the window function w[n] is described by $$a[n] = w[n](x[n] - \mu_x) \forall n \quad (4)$$

The autocorrelation function for x is derived from $r_a[\tau]$ and scaled element by element of the autocorrelation function for the window function $r_w[\tau]$.

$$r_x[\tau] = \frac{r_a[\tau]}{r_w[\tau]} \quad (5)$$

Figure 3A:
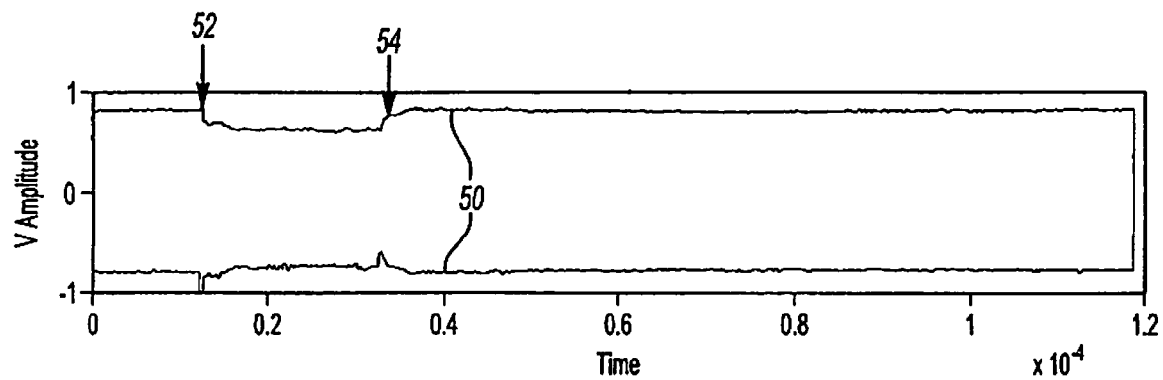
FIGS. 3A and 3B are respective waveforms of normalized RF voltage and current signals.
Figure 3B:
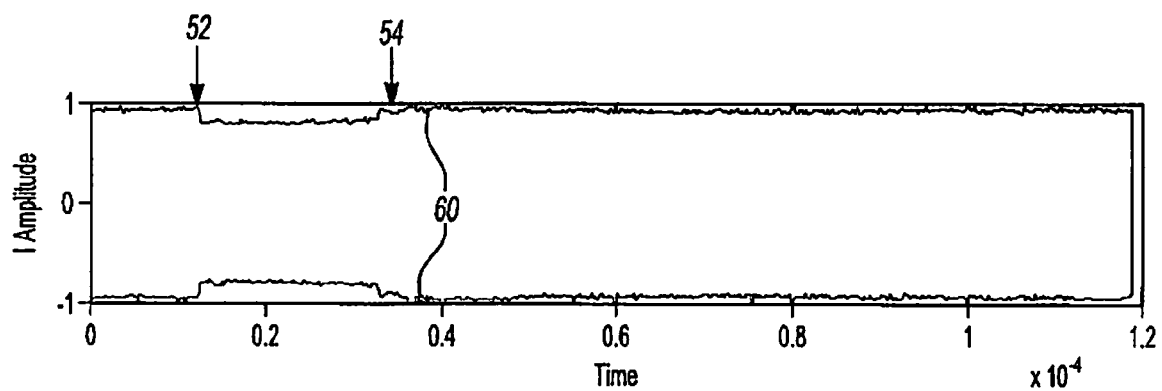

From non-overlapping blocks of samples from A/D module 20, a reliable block processing scheme for arc detection can be achieved. Referring now to FIGS. 3A and 3B, plots of normalized samples acquired at a rate of 100 MSPS are shown. FIG. 3A shows a voltage envelope 50 and FIG. 3B shows current envelope 60. An arc event occurs at approximately 150 µS, which is indicated at arrow 52 and ends approximately 23 µS later as indicated at arrow 54. By visual inspection, the transient behavior is detectable in the voltage and current signals.

Figure 4:
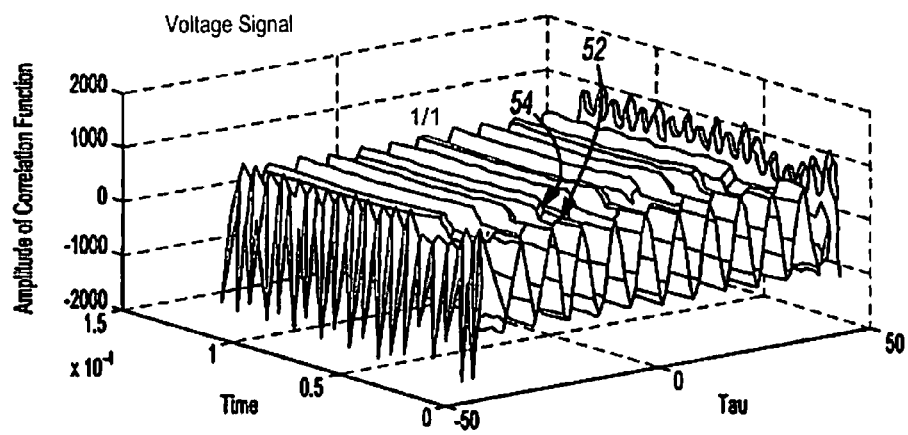
FIG. 4 is a graph of an autocorrelation function of the RF voltage signal of FIG. 3A.
Figure 5:
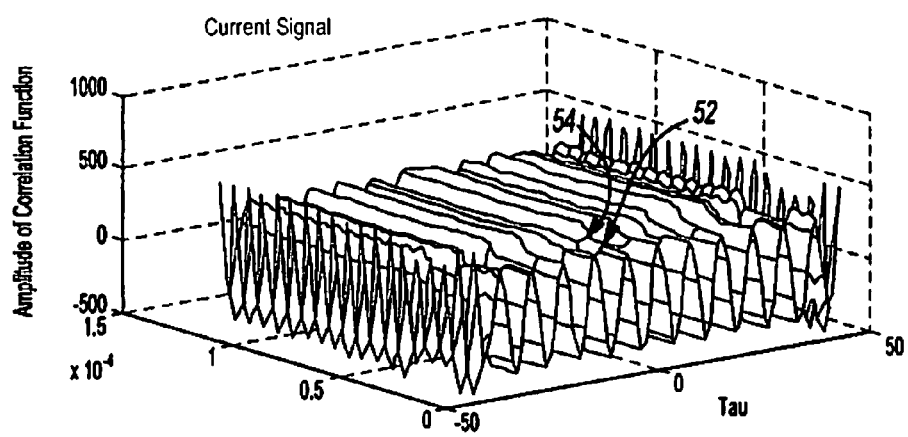
FIG. 5 is a graph of an autocorrelation function of the RF current signal of FIG. 3B.
Figure 6:
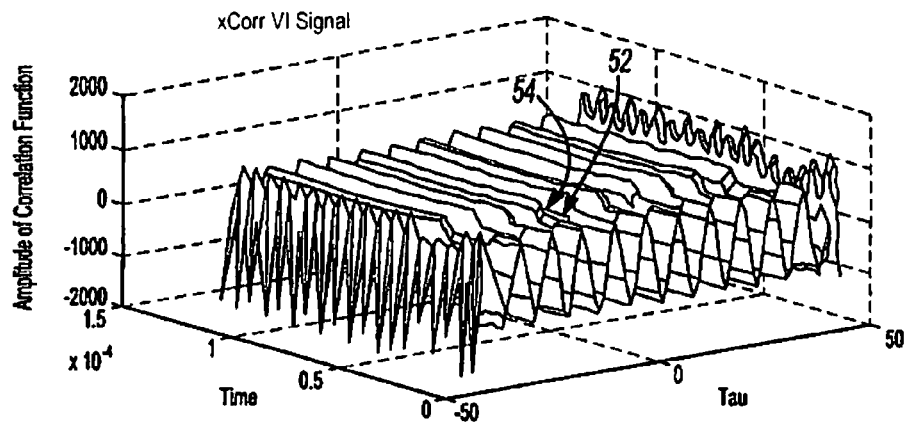
FIG. 6 is a graph of cross correlation of the RF voltage and current signals of FIGS. 3A and 3B.
Figure 7:
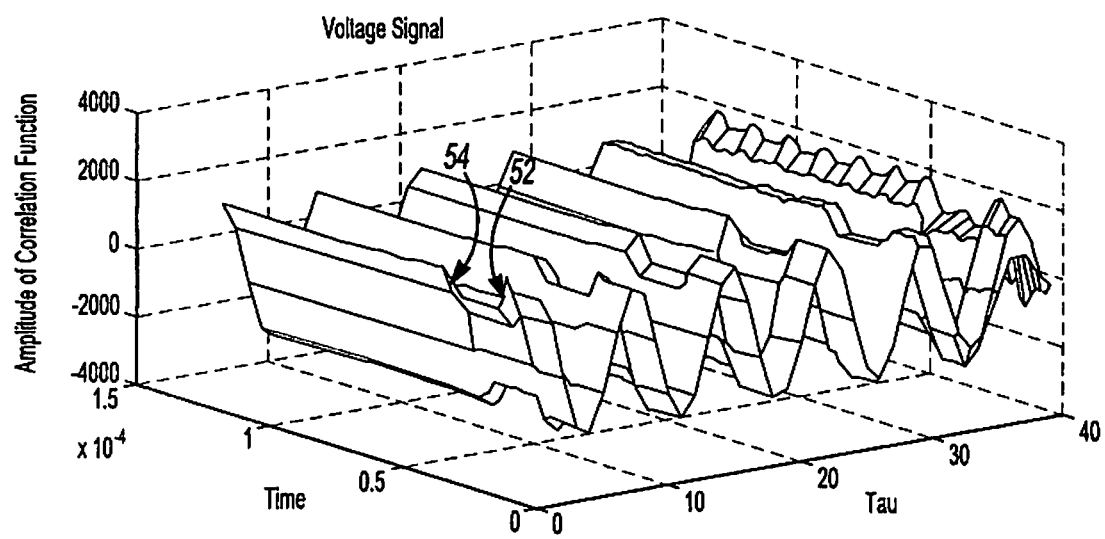
FIG. 7 is a graph of an autocorrelation function of the RF voltage signal for k:=4.
Figure 8:
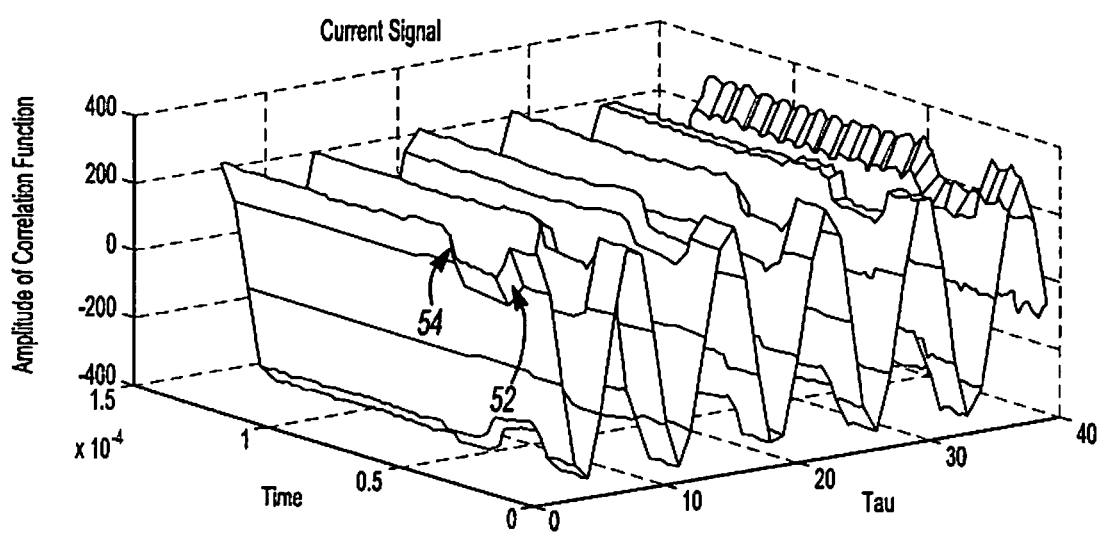
FIG. 8 is a graph of an autocorrelation function of the RF current signal for k:=4.

For M:=6 and N:=44, the autocorrelation function is computed for the voltage and currents signals using a Hanning window of length N. The autocorrelation for the voltage signal is shown in FIG. 4. FIG. 5 shows the autocorrelation function for the current signal. Since the voltage and current signals contains the periodic component for the fundamental frequency (13.56 MHz in this case, however it should be appreciated that other frequencies may be used) the corresponding correlation functions are also periodic. Lags of τ also indicate periodic harmonic components emitted from the plasma. At time 52, the autocorrelation functions produce an abrupt change that coincides with the initial appearance of the arc event. After momentarily achieving a steady state value to indicate the arc is occurring, the autocorrelation functions again indicate a sharp transition that coincides with the end of the arc event at time 54. FIG. 6 shows cross correlation function $r_{vi}[\tau]$; also produces a periodic function with a visually detectable arc event.

The arc detection method should be invariant to different plasma load impedance and power levels. The cross correlation function of the voltage and current signals provides immunity to a broader range of signals over an entire Smith Chart. The arc event is apparent between times 52 and 54 (see FIG. 6) and detectable from the cross correlation function. Next is a description of how the function can be used for an arc event detector.

Analysis module 22 should keep false positive arc detections to a minimum. To achieve this, analysis module 22 includes probabilistic module 36. Probabilistic module 36 implements a probabilistic framework that assigns likelihood to the number of arc events detected. False positive could be attributed to normally occurring transients and instabilities arising from a change in power levels or even more abrupt, the ignition of the plasma. The solution to the latter is employ enable signal 28 to engage arc detection when the plasma is in a steady state. This is important in applications like pulsing, where the plasma state following transition periods could otherwise be mistakenly detected as an arc event.

Figure 9:
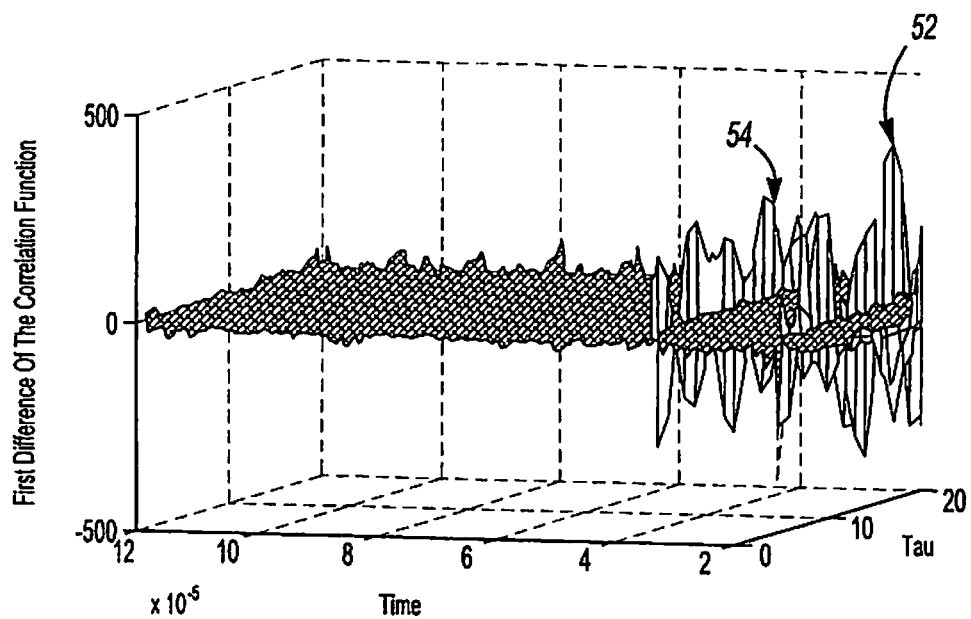
FIG. 9 is a graph of a first difference of the autocorrelation function for the voltage signal of FIG. 3A.
Figure 10:
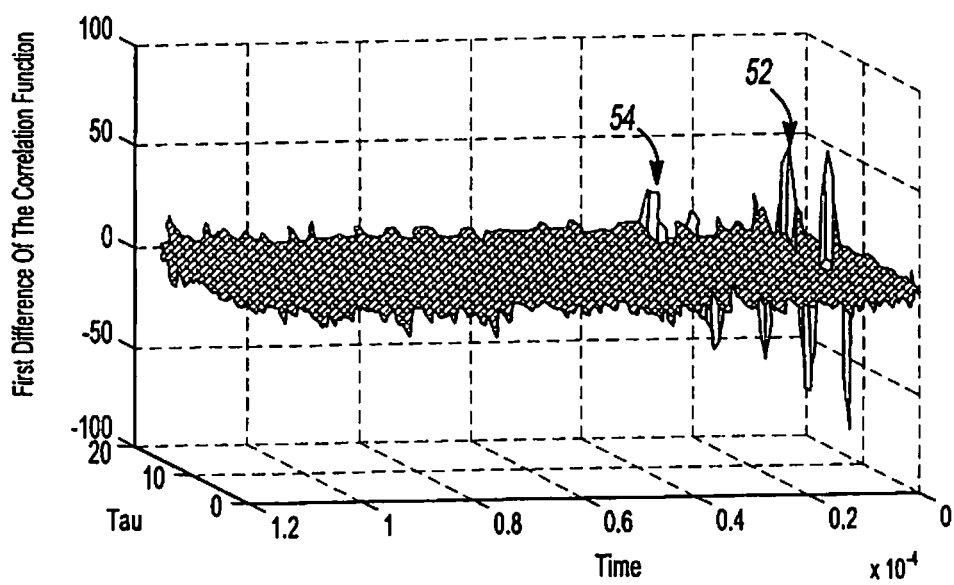
FIG. 10 is a graph of a first difference of the autocorrelation function for the current signal of FIG. 3B
Figure 11:
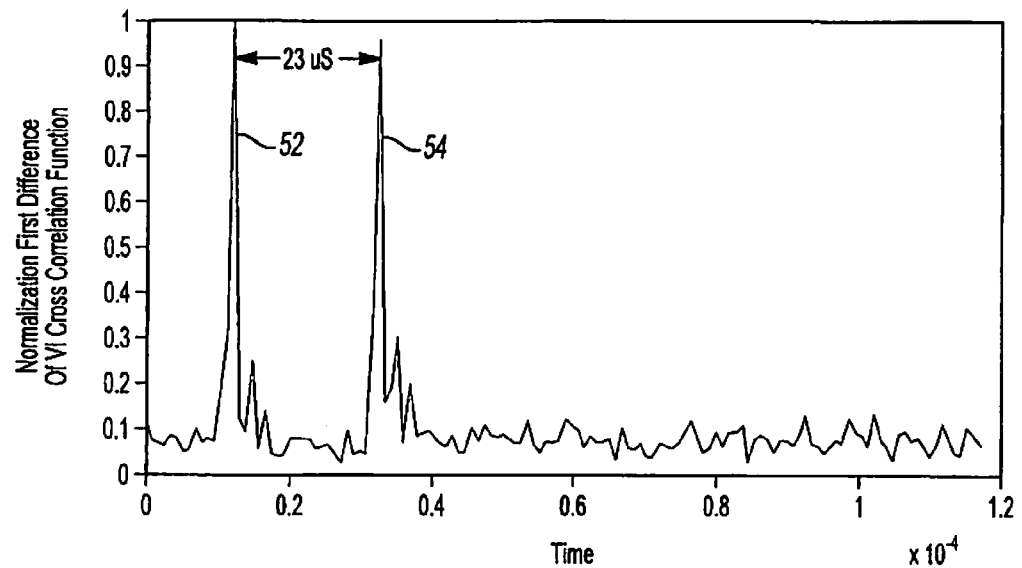
FIG. 11 is a graph of normalized output for cross correlation of the voltage and current signals.

Correlation module 34 implements a first difference of the correlation function with respect to the $j^{th}$ correlation function, $r_{vi}^j - r_{vi}^{j-1}$. In the first difference of the autocorrelation functions for the voltage (FIG. 9) and current signals (FIG. 10), prominent ridges are detectable for instances in time to detect the commencement and extinguishment of the arc event. FIG. 11 shows a plot of the normalized output for the cross correlation of the voltage and current. In this plot, the duration of the arc even is palpable with the duration time indicated.

Figure 12A:
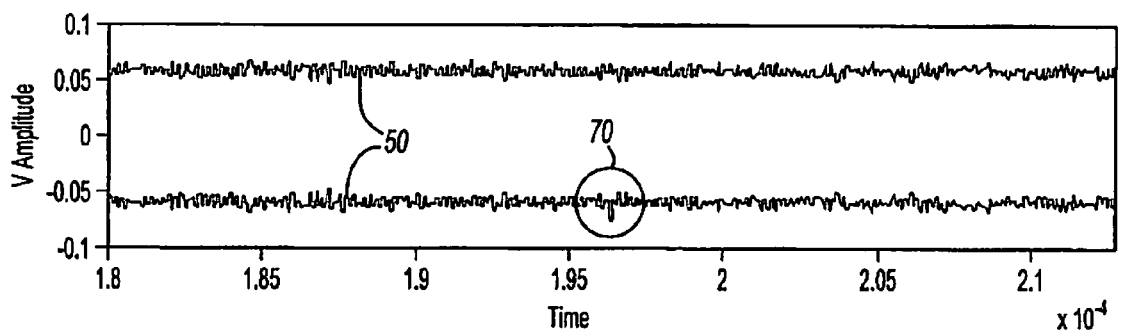
FIGS. 12A and 12B are respective waveforms of a normalized voltage signal and normalized current signal of an arc having brief duration when compared to a sample interval.
Figure 12B:
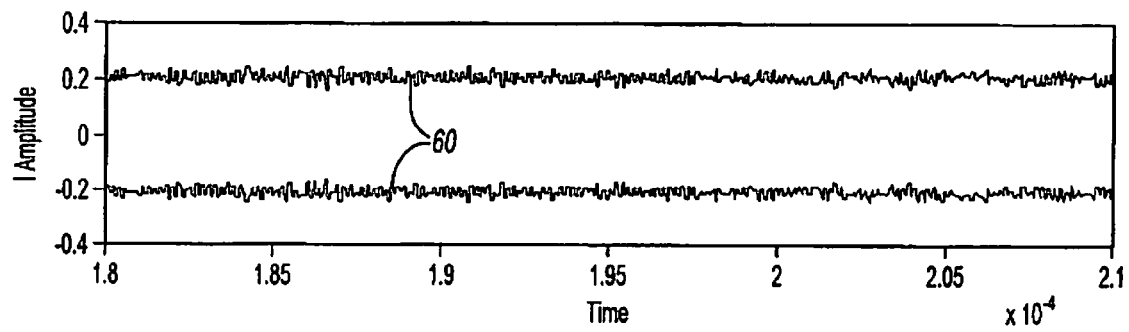
Figure 13:
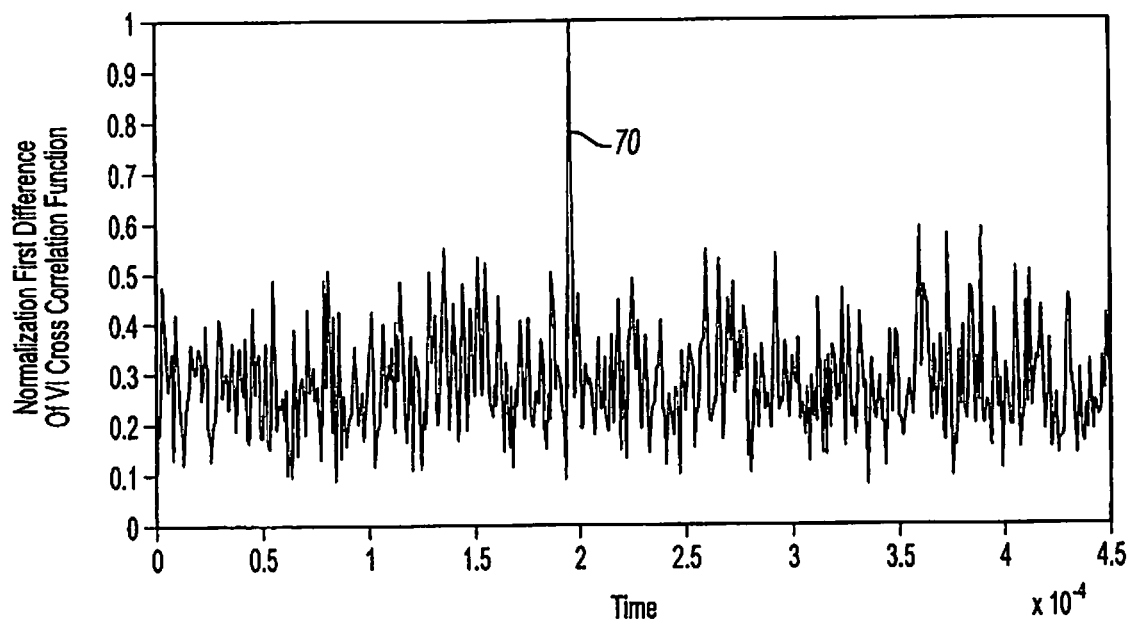
FIG. 13 is a graph of the arc event of FIGS. 12A and 12B detected by block processing the time difference of a VI cross correlation function, k:=4.

Since the correlation function is even, an efficient implementation of the arc detection can be implemented by considering only half of the correlation function. Additionally, only the correlation functions for every $k^{th}$ block of N samples need to be processed. This scenario is examined under a challenging condition where the arc event is in the order of a few samples with low signal amplitude when compared to the arc event of FIGS. 3A and 3B. The data used for this case is shown in FIGS. 12A and 12B. FIG. 12A shows voltage envelope 50 and FIG. 12B shows current envelope 60. The arc is shown as descending spike at 70. For k:=4, the corresponding arc detection, indicated with large spike response at the arc event 70. The arc detection using the cross correlation function for voltage and current is shown at FIG. 13.

Figure 14:
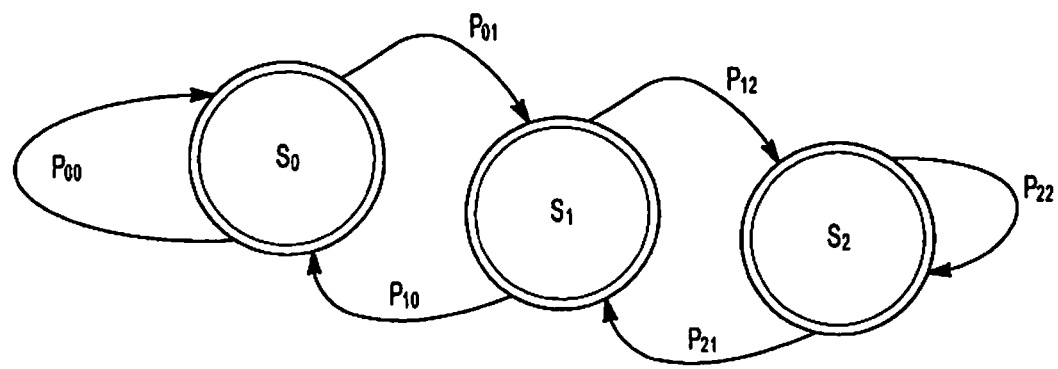
FIG. 14 is a Markov chain describing the arc process.

Referring now to FIG. 14, a first-order Markov chain is shown that describes the probabilistic framework for a procedure to analyze the transitions of an arc event. By sequentially aligning this model to an index such as time, a trellis is created that spans a duration. The duration could equate to the length of time for a process step, the entire process, or greater.

The Markov chain includes three states: no arc ($S_0$), arc event detected ($S_1$), and arc event occurring ($S_2$). Probabilities are also presented to describe the transition probabilities $P_{mn}$ from state m to state n. From the two examples used to describe our approach, we can ascertain how this model reflects the detection of varying durations of arcs. In the first example of FIGS. 3A and 3B the arc event lasted approximately 23 uS. For that case, the Markov chain would start at state $S_0$ and transition to $S_1$ when the arc event was detected at time 52. Since that example had an arc event that remained active, the transition from $S_1$ to $S_2$ would be indicative of this scenario. During the arc event, the state would remain in $S_2$ until the end of the arc event was detected at time 54. At time 54 the state transition from $S_2$ to $S_1$ would occur and finally $S_1$ to $S_0$ to indicate the extinguishment of the arc. These discrete state transitions are described by a sequence of V:=[ . . . $S_0$ $S_0$ $S_1$ $S_2$ $S_2$ . . . $S_2$ $S_2$ $S_1$ $S_0$].

Similarly, the sequence to describe the second arc event depicted in FIGS. 12A and 12B would be of V:=[S$_0$ S$_0$ S$_1$ S$_1$ S$_0$]. The transition to S$_{12}$ does not occur there because of the short duration of the arc event.

The eloquence of using this framework is it provides the capability to determine the likelihood of an arc event from which the system engineer can use this information to adjust the process parameters and quantitatively determine the resulting improvement. The decoding of this sequence, using observations from the arc detector, is accomplished by using the Viterbi algorithm. This algorithm produces the probability of the observed sequence from $$P(V) = \sum_{\forall j} P(V \mid w_j) P(w_j),$$

where w represents the vector of unobservable states in our model It should be appreciated that no limitation is placed on including other observable information such as RF and other process affecting parameters.

As a quantitative indicator to aid the system engineer with improvements attributed to process adjustments, the state transition probabilities can also be computed. As adjustments are made and the process is run, the observable information is collected. Using this information with a post-process algorithm, the transition probabilities can be computed and compared to the state transition probabilities prior to the adjustments. These probabilities are computed using an expectation maximization algorithm. The expectation maximization algorithm is an iterative algorithm used to maximize the model parameters based on the observed data. There are two steps to the expectation maximization algorithm. In the first step, the probabilities are marginalized given the current model. For the first iteration, initial conditions are applied to the model. During the second iteration the model parameters are optimized. This procedure iterates over these two steps until convergence of the model parameters is achieved. The procedure is described by the pseudo-code of Table 1.

TABLE 1

1.) Initialize model parameters and obtain observation data
2.) Until Convergence
   a. Compute the estimated transition probabilities α(j)
   b. Compute the estimated state probabilities β(j)
   c. Update α(j+1) := α(j)
   d. Update β (j+1) := β (j)
3.) End In some embodiments, analysis module 22 may be implemented in the analog domain. In such embodiments A/D module 20 may be eliminated (see FIG. 1) and analysis module 22 receives analog first and second signals from RF sensor 16. Also, subtraction module 30, window module 32, the window function, and correlation module 34 are also implemented in the analog domain.

Referring now to FIGS. 15-20, the operation of correlation module 34 according to some embodiments of the present disclosure is disclosed. Correlation module 34 may implement the autocorrelation function:

$$r_{vi}(\tau) = \sum_{\forall n} v[n] i[n-\tau], \quad (6)$$

where v[n] is the sampled voltage of RF plasma generator system 10 at time n; i[n] is the sampled current of RF plasma generator system 10 at time n; τ is a lag or delay in the function; and $r_{vi}(\tau)$ is the cross correlation of voltage and current of RF plasma generator system 10 with a delay of τ.

For a delay of zero, i.e., when τ equals zero, the cross correlation function is a dot product equivalent to the power present in the voltage and current signals. In order to obtain a more suitable result and to ameliorate the negative effects of offsets, e.g., those caused by the sampling rate not being coherent to the frequencies of the fundamental signal, the mean is subtracted from each of the voltage and current signals before performing the cross correlation. Thus, the power of the signal at time n is characterized by the following equation:

$$r_{vi}(\tau := 0) = \sum_{\forall n} (v[n] - E[v[n]])(i[n] - E[i[n]]), \quad (7)$$

where v[n] is the sampled voltage of RF plasma generator system 10 at time n; i[n] is the sampled current of RF plasma generator system 10 at time n; $r_{vi}(\tau:=0)$ is the cross correlation of voltage and current of RF plasma generator system 10 with no delay; E[v[n]] is the mean of v[n], which may be determined by Eq. (2) above; and E[i[n]] is the mean of i[n], which may be determined by Eq. (2) above. The determination of the cross-correlation of the voltage and current signals, with no delay, i.e., when τ=0, provides the power present in the fundamental signal.

Abrupt changes in the power delivered to RF plasma generator system 10 may be indicative of an arc in the system, as described above in relation to the cross correlation at various delay times. Further, the duration of an arc event may also be determined based upon the monitoring of the cross correlation of the two signals as described herein. Based on these two determinations, i.e., the duration of and change in power during an arc event, the energy lost in the arc event may be determined by the following equation:

Energy=ΔP·t, (8)

where ΔP is the difference between the cross correlation (with no delay) of the voltage and current signals preceding the arc event with that during the arc event, e.g., determined by the equation above; and t is the time duration of the arc event. Based on this equation, the system engineer may estimate the change in energy delivered to the plasma chamber 18.

Figure 15:
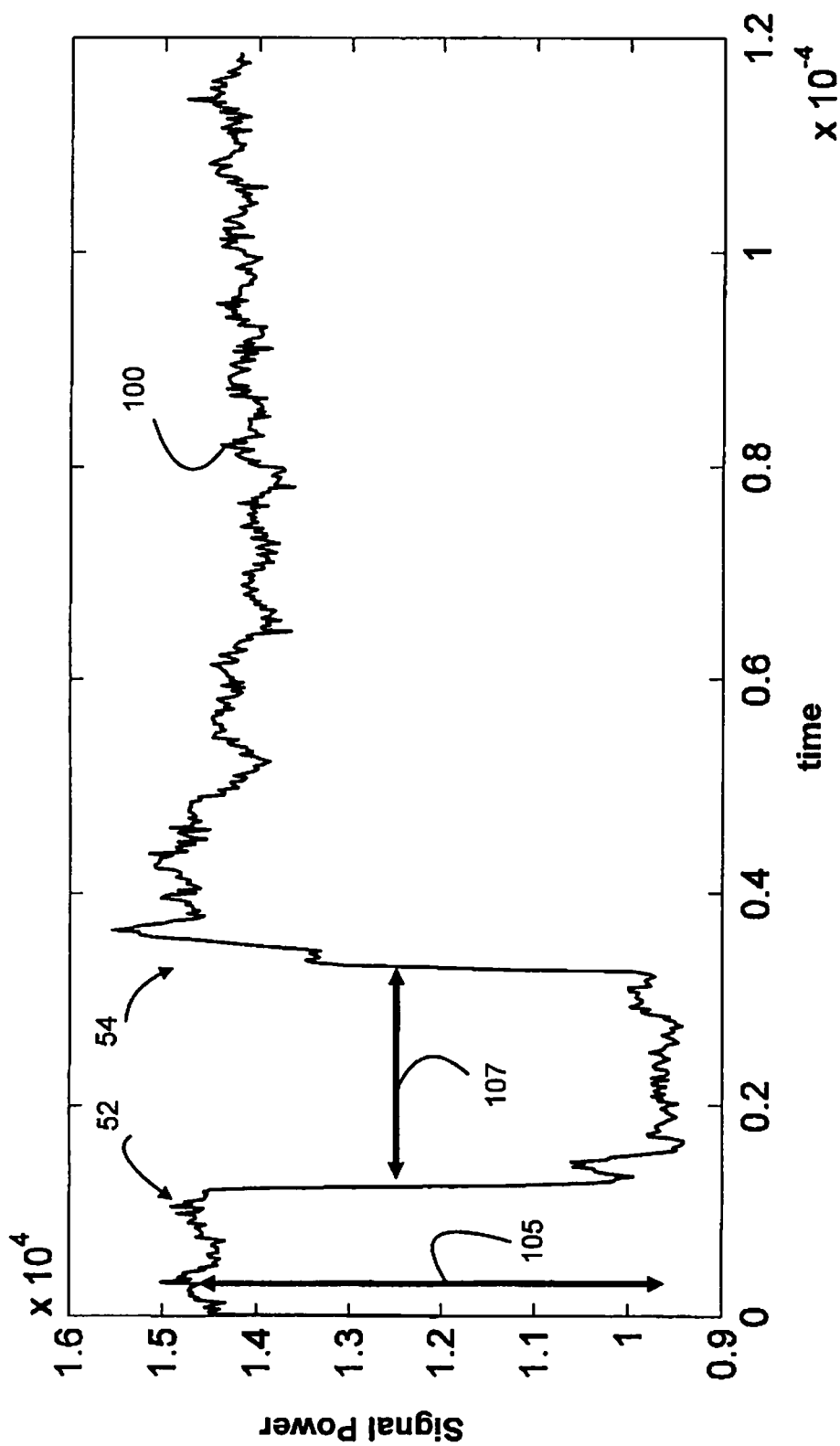
FIG. 15 is a graph of a signal power versus time for an RF plasma generation system.

Referring now to FIG. 15, waveform 100 is a graph of the signal power determined by cross correlation function $r_{vi}(\tau:=0)$ on the y-axis versus time on the x-axis. Waveform 100 is based on a fundamental signal frequency at 13.56 MHz and a sample rate of 100 MSPS, which corresponds approximately with 7.4 samples per period. The beginning of the arc event is indicated at arrow 52 and arc event ends approximately 23 us later, at a time indicated by arrow 54. Arrowed line 105 indicates the change in the power of the signal during the arc event, while arrowed line 107 indicates the time duration of the arc event. Because the voltage and current signals are not calibrated, and are based on the measured voltage and current rather than the actual voltage and current, the change in power will also be uncalibrated and related to the measured power, and not the actual power, of the signal. If, instead, the change in power determined by the cross correlation function was calibrated to a National Institute of Standards and Technology traceable standard, the result would comprise the change in actual power of the signal. As stated above, the energy lost during the arc event can be estimated by multiplying the change in power by the duration of the arc event.

Figure 16:
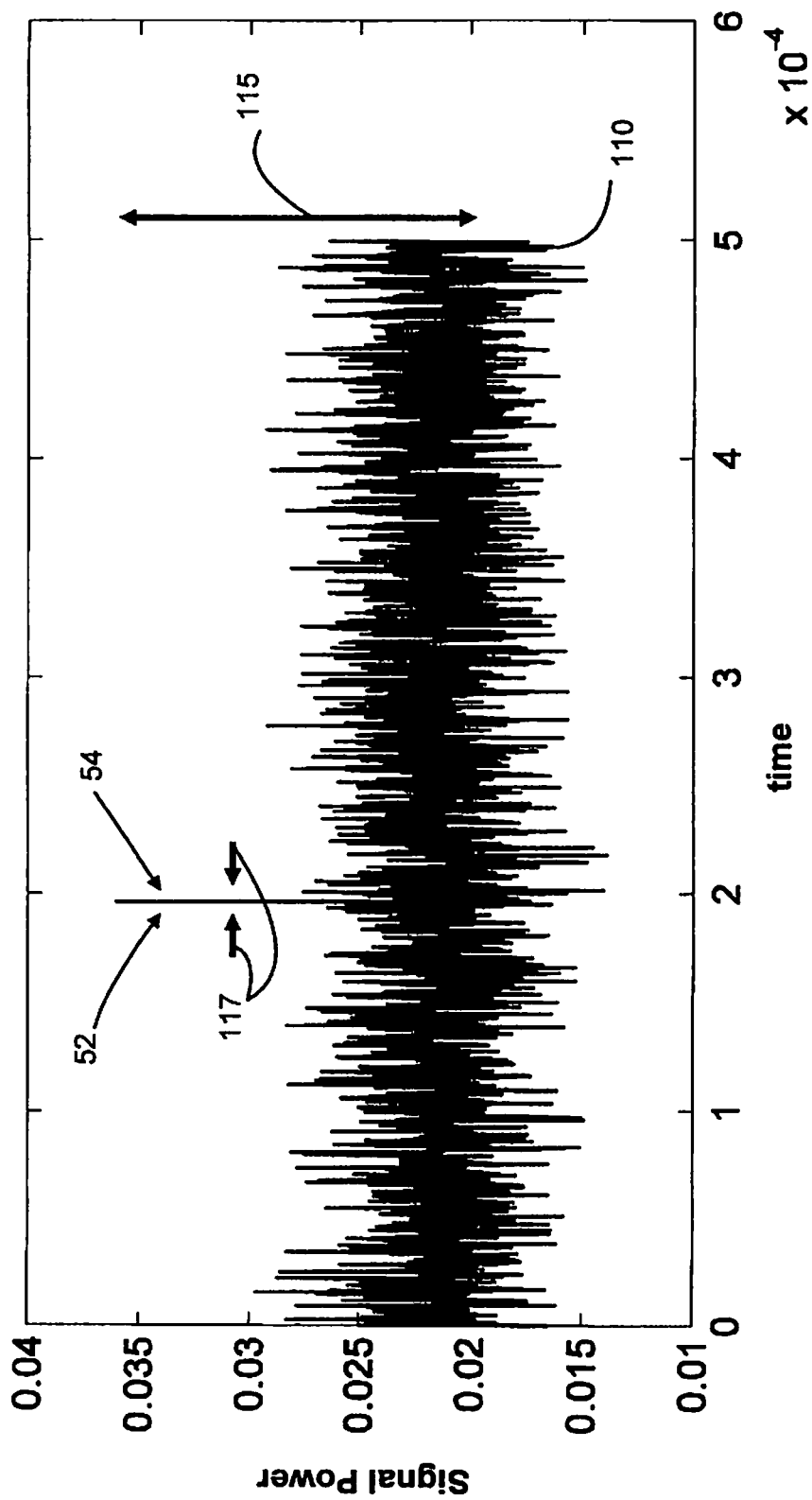
FIG. 16 is a graph of a signal power versus time for an RF plasma generation system.

Now referring to FIG. 16, waveform 110 is a graph of the signal power versus time that illustrates a short duration arc event. Similar to that described above, arrow 52 indicates the beginning of the arc event while arrow 54 indicates the end of the arc event. The time duration of the arc event is indicated by arrows 117. The change in power is indicated by arrowed line 115. In FIG. 16, the time duration of the arc event is limited to one cross correlation block. Thus, the time duration is estimated to be equal to the time duration between such blocks. Thus, and additionally due to the fact that the change in power determined by the cross correlation function is also an estimate of the change in measured power, the energy of the arc event comprises an estimation rather than an exact value.

Figure 17:
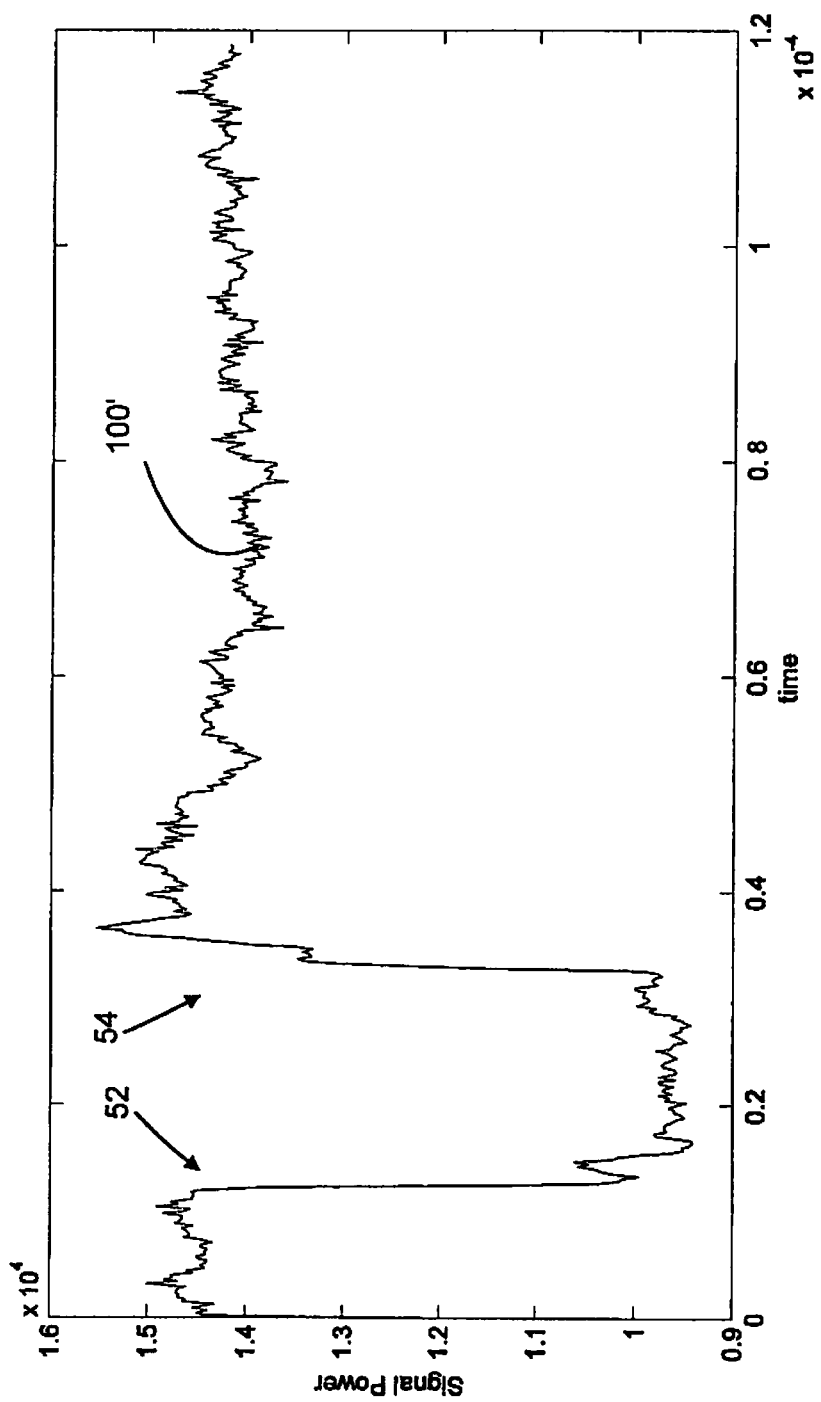
FIG. 17 is a graph of a signal power versus time for an RF plasma generation system.
Figure 18:
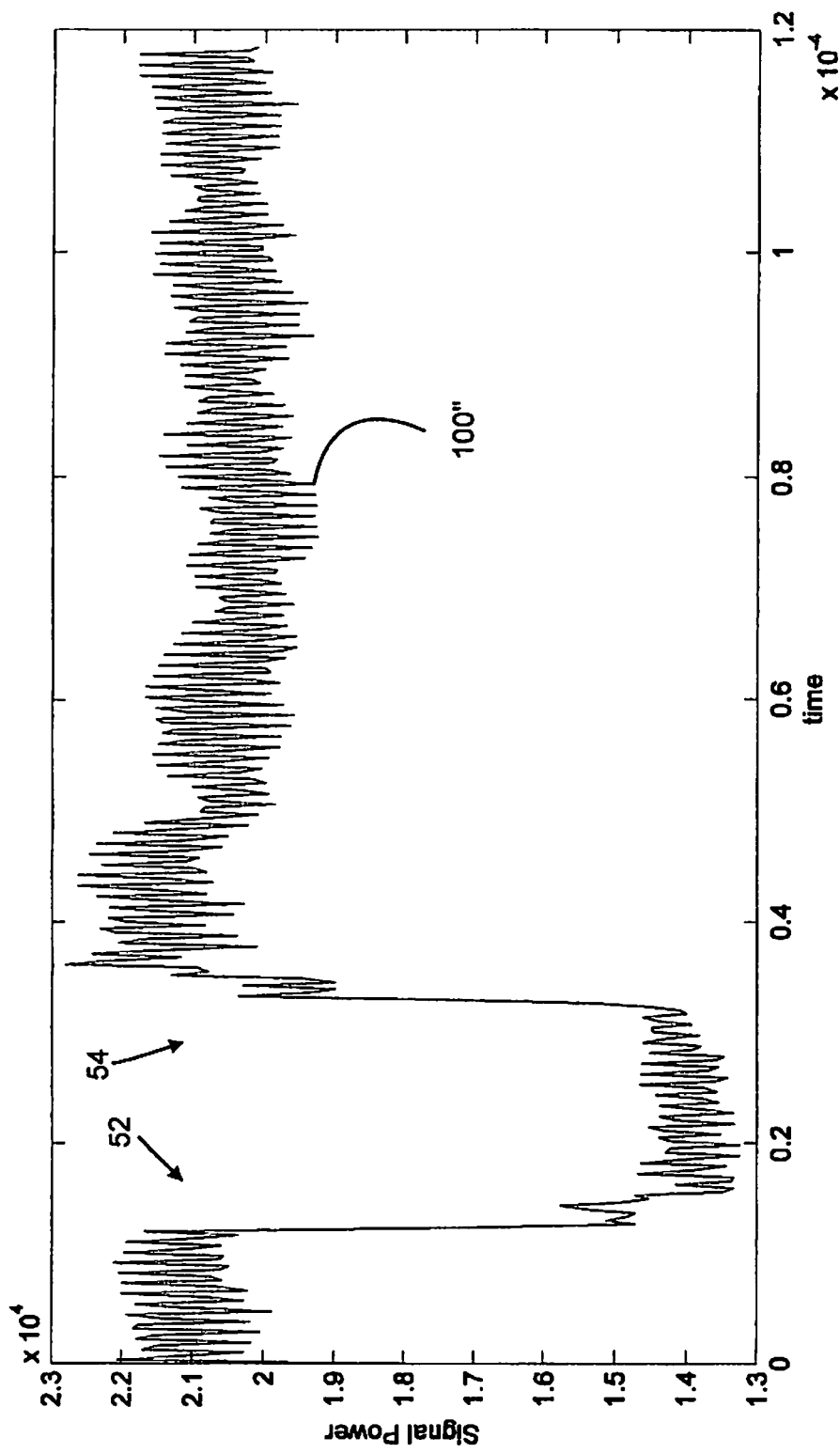
FIG. 18 is a graph of a signal power versus time for an RF plasma generation system.

Referring now to FIGS. 17 and 18, signal power waveforms 100' and 100" comprise alternate signal powers of waveform 100 above in which the number of samples per period is equal to 22 and 32, respectively. Based on these graphs, it is apparent that waveform 100" is a more variable (or, noisier) version of the waveform 100 and is, therefore, less suitable for estimating the energy of the arc event. For this reason, the number of samples per period (referred to herein as N) plays a role in the accuracy of the measurement system and should not be arbitrarily chosen.

Figure 19:
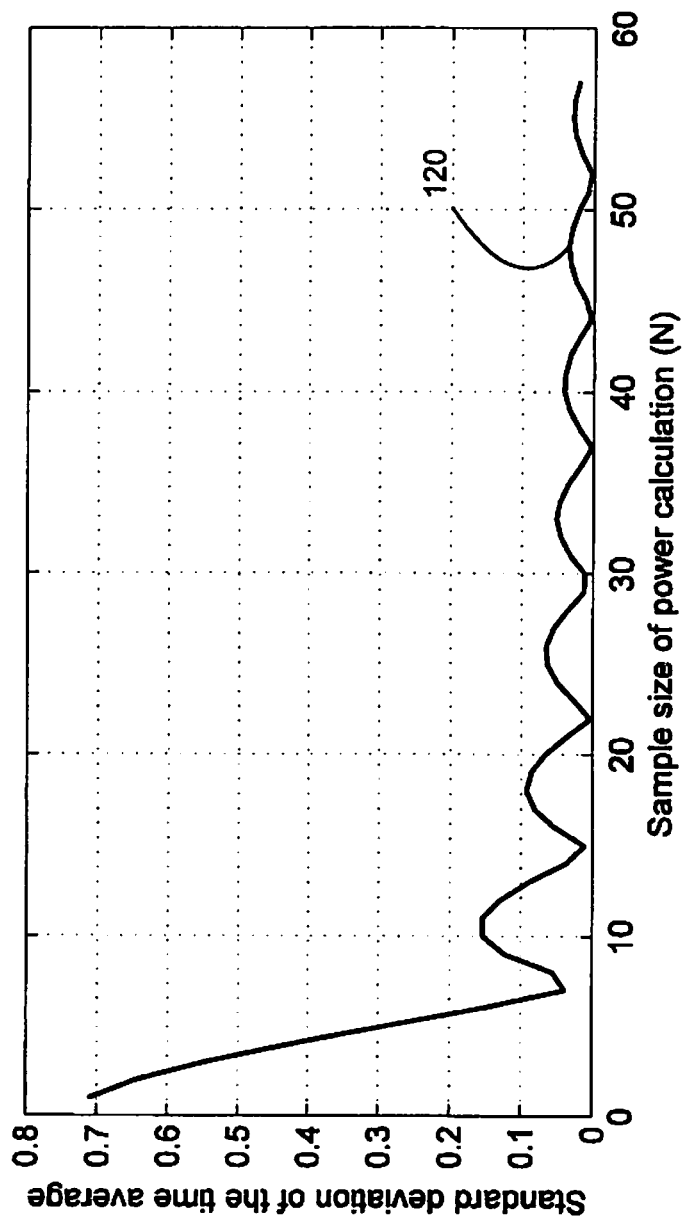
FIG. 19 is a graph of the standard deviation of the time average of the signal power of FIG. 15 versus the sample size of the power calculation.

Referring now to FIG. 19, the standard deviation 120 of the time average of the cross correlation function versus sample size is illustrated. As stated above, waveform 100 is based on an RF generator 12 frequency of 13.56 MHz and a 100 MSPS sampling rate. Based on these set points, the number of samples is approximately equal to 7.4 per period. Based on the standard deviation waveform 120, in which the standard deviation reaches its valleys at periodic intervals, the number of samples per period should be selected to be an integer multiple of the number of samples in the period of interest in order to obtain the most suitable signal power estimation. Thus, as illustrated in FIGS. 17 and 18, it is expected that waveform 100', in which the number of samples per period is equal to 22, is more suitable than waveform 100", which is related to the number of samples being equal to 32 per period, since the number 22 more closely corresponds with an integer multiple of 7.4 than does the number 32.

Figure 20:
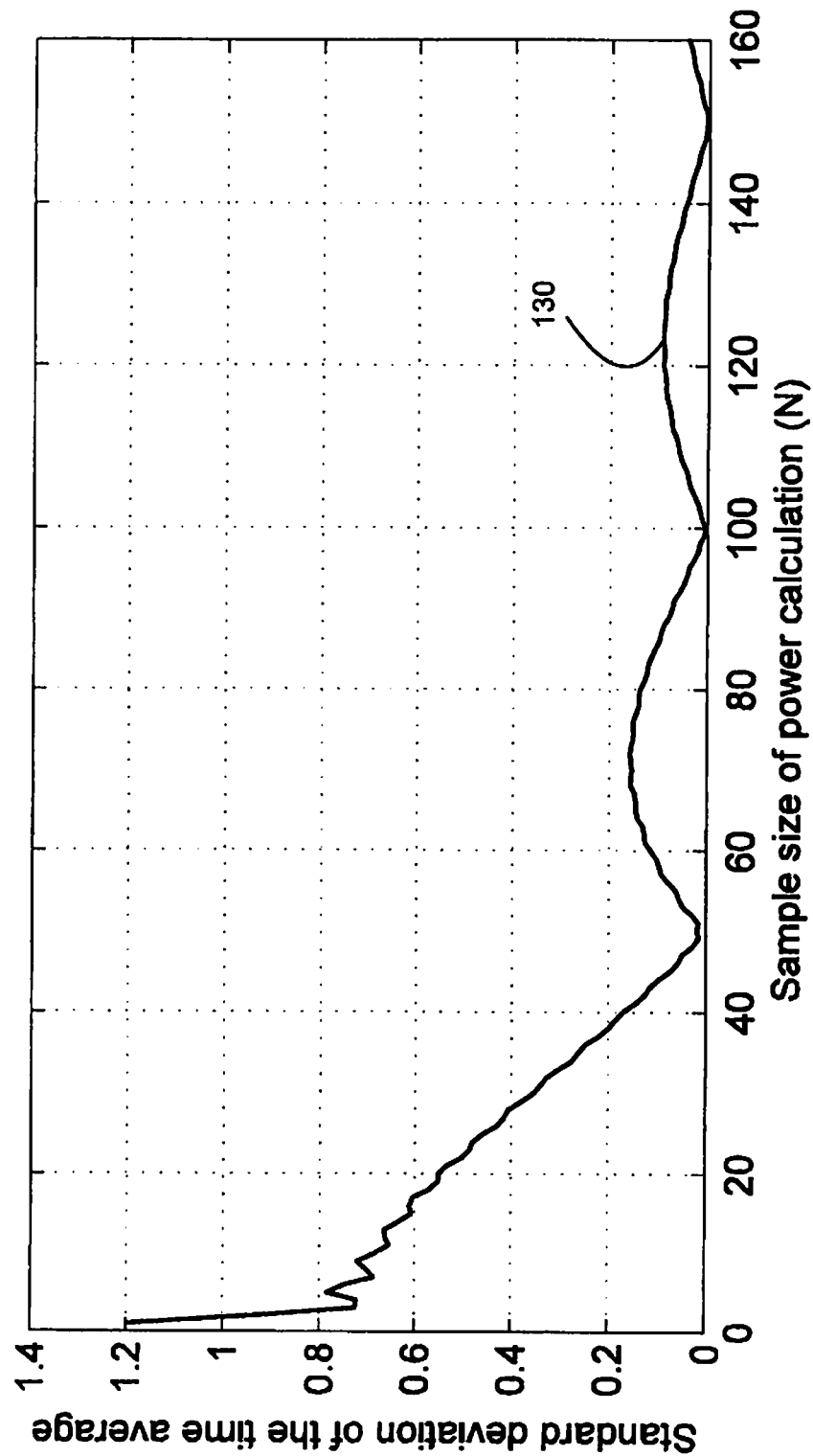
FIG. 20 is a graph of the standard deviation of the time average of the signal power for a dual frequency RF plasma generation system versus the sample size of the power calculation.

Referring now to FIG. 20, a graph of the standard deviation 130 of the time average of the power of a dual frequency RF generator system versus the sample size of the power calculation is illustrated. The dual frequencies are 2 MHz and 27.12 MHz in this example. As illustrated, the standard deviation 130 reaches its valleys at multiples of the number of samples in the period of interest corresponding to 2 MHz, i.e., at multiples of 50. Thus, in dual or multi-frequency systems, the number of samples per period should be chosen based on the lowest frequency of the RF generator.

Those skilled in the art can now appreciate from the foregoing description that the broad teachings of the disclosure can be implemented in a variety of forms. Therefore, while this disclosure includes particular examples, the true scope of the disclosure should be not so limited since other modifications will become apparent to the skilled practitioner upon a study of the drawings, the specification, and the following claims.

What is claimed is:

1. An arc detection system for a plasma generation system, comprising:

a radio frequency (RF) sensor that generates first and second signals based on a respective electrical properties of RF power that is in communication with a plasma chamber; and an analysis module that generates an arc detect signal based on the first and second signals, the analysis module including:

a subtraction module that subtracts a signal level from the respective first and second signals to define subtracted first and second signals;

a window module that applies a window function to the subtracted first and second signals to generate first and second window signals, wherein successive windows are non-overlapping;

a cross-correlation module that cross-correlates the first and second window signals to generate an arc detect signal;

wherein the arc detect signal indicates whether an arc is occurring in the plasma chamber.

2. The arc detection system of claim 1, wherein the analysis module determines an estimated energy of the arc based on the first and second signals.

3. The arc detection system of claim 1, further comprising a window module that applies a window function to the subtracted first and second signals to generate first and second window signals, wherein successive windows are non-overlapping.

4. The arc detection system of claim 1, further comprising a probabilistic module that computes a probability of an arc event based on the arc detect signal.

5. The arc detection system of claim 4, wherein the probabilistic module employs a Baum-Welch algorithm to calculate a probabilistic model of the arc event.

6. The arc detection system of claim 5, wherein the probabilistic module employs a Viterbi algorithm to compute the probability of the arc event.

7. The arc detection system of claim 1, wherein the analysis module receives an enable signal that selectively enables generating the arc detect signal.

8. The arc detection system of claim 1, further comprising an analog-to-digital (A/D) conversion module that digitizes the first and second signals.

9. The arc detection system of claim 1, wherein the RF sensor is a directional coupler and the first and second signals represent a forward power and reflected power, respectively, of the RF power.

10. The arc detection system of claim 1, wherein the RF sensor is a voltage/current (V/I) sensor and the first and second signals represent a voltage and current, respectively, of the RF power.

11. The arc detection system of claim 10, wherein an estimated energy of the arc is determined by multiplying a duration of the arc and a difference in a power estimate of the voltage and current of the RF power during the arc.

12. The arc detection system of claim 11, wherein the power estimate is determined by the equation:

$$r_{vi}(\tau:=0) = \sum_{\forall n} (v[n] - E[v[n]])(i[n] - E[i[n]]),$$

wherein v[n] is the voltage at time n; i[n] is the current at time n; $r_{vi}(\tau:=0)$ is the power estimate at time n ; E[v[n]] is a mean of v[n] at time n; E[i[n]] is a mean of i[n] at time n; and ∀n comprises all times n in a window of interest.

13. An arc detection method for a plasma generation system, comprising:
- generating first and second signals based on respective electrical properties of radio frequency (RF) power that is in communication with a plasma chamber;
- subtracting a signal level from respective ones of the first and second signals to define subtracted first and second signals;
- applying a window function to the substracted first and second signals to define first and second window signals, wherein successive windows are non-overlapping; and
- cross-correlating the first and second window signals to generate an arc detection signal.

14. The method of claim 13 further comprising employing the arc detect signal to vary an aspect of the RF power to extinguish the arc.

15. The arc detection method of claim 13, further comprising generating an estimated energy of the arc based on the first and second signals.

16. The arc detection method of claim 13, further comprising computing a probability of an arc event based on the arc detect signal.

17. The arc detection method of claim 16, wherein the computing step further comprises employing a Baum-Welch algorithm to calculate a probabilistic model of the arc event.

18. The arc detection method of claim 17, wherein the computing step further comprises employing a Viterbi algorithm to compute the probability of the arc event.

19. The arc detection method of claim 13, further comprising receiving an enable signal that selectively enables generating the arc detect signal.

20. The arc detection method of claim 13, further comprising digitizing the first and second signals.

21. The arc detection method of claim 13, wherein the first and second signals represent a forward power and reflected power, respectively, of the RF power.

22. The arc detection method of claim 13, wherein the first and second signals represent a voltage and current, respectively, of the RF power.

23. The arc detection method of claim 22, wherein an estimated energy of the arc is determined by multiplying a duration of the arc and a difference in a power estimate of the voltage and current of the RF power during the arc.

24. The arc detection method of claim 23, wherein the power estimate is determined by the equation:

$$r_{vi}(\tau := 0) = \sum_{\forall n} (v[n] - E[v[n]])(i[n] - E[i[n]]),$$

wherein $v[n]$ is the voltage at time n; $i[n]$ is the current at time n; $r_{vi}(\tau{:=}0)$ is the power estimate at time n; $E[v[n]]$ is a mean of $v[n]$ at time n; $E[i[n]]$ is a mean of $i[n]$ at time n; and $\forall n$ comprises all times n in a window of interest.

* * * * *

UNITED STATES PATENT AND TRADEMARK OFFICE
CERTIFICATE OF CORRECTION

PATENT NO. : 8,581,597 B2
APPLICATION NO. : 13/648317
DATED : November 12, 2013
INVENTOR(S) : David J. Coumou Page 1 of 1

It is certified that error appears in the above-identified patent and that said Letters Patent is hereby corrected as shown below:

On the Title Page

(73) Assignee: Line 1, delete "MSK" and insert --MKS--.

In the Specification

Column 3,
Line 30, delete "en" and insert --$\forall n$--.
Line 31, delete "$\forall n$" and insert --all--.

Column 4,
Line 3, delete "en" and insert --$\forall n$--.
Line 4, delete "$\forall n$" and insert --all--.

Column 10,
Line 59, delete "us" and insert --$\mu s$--.

In the Claims

Column 12,
Line 64, Claim 12, delete "n ;E[v[n]]" and insert --n; E[v[n]]--.

Signed and Sealed this
Twentieth Day of August, 2019

Andrei Iancu
*Director of the United States Patent and Trademark Office*